(12) United States Patent
Balimann et al.

(10) Patent No.: US 10,088,140 B2
(45) Date of Patent: Oct. 2, 2018

(54) EYE-SAFE OPTOELECTRONIC MODULE

(71) Applicant: Heptagon Micro Optics Pte. Ltd., Singapore (SG)

(72) Inventors: Martin Lukas Balimann, Zürich (CH); Matthias Gloor, Boswil (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 15/614,986

(22) Filed: Jun. 6, 2017

(65) Prior Publication Data

US 2017/0350581 A1  Dec. 7, 2017

Related U.S. Application Data

(60) Provisional application No. 62/346,736, filed on Jun. 7, 2016.

(51) Int. Cl.
| | |
|---|---|
| *F21V 25/00* | (2006.01) |
| *F21V 3/00* | (2015.01) |
| *F21V 5/00* | (2018.01) |
| *H01S 5/183* | (2006.01) |
| *H01S 5/42* | (2006.01) |
| *F21Y 115/30* | (2016.01) |

(52) U.S. Cl.
CPC ............. *F21V 25/00* (2013.01); *F21V 3/00* (2013.01); *F21V 5/004* (2013.01); *F21Y 2115/30* (2016.08); *H01S 5/183* (2013.01); *H01S 5/423* (2013.01)

(58) Field of Classification Search
CPC . F21V 25/00; F21V 5/004; F21V 3/00; F21Y 2115/30; H01S 5/423; H01S 5/183
USPC .......... 250/493.1, 504 R; 359/237, 245, 315, 359/599
See application file for complete search history.

(56) References Cited

U.S. PATENT DOCUMENTS

| | | | |
|---|---|---|---|
| 6,431,731 B1 * | 8/2002 | Krietzman | H01S 3/005 359/28 |
| 8,474,976 B2 | 7/2013 | Duong et al. | |
| 8,885,882 B1 | 11/2014 | Yin et al. | |
| 8,908,917 B2 | 12/2014 | Durnell et al. | |
| 8,929,589 B2 | 1/2015 | Publicover et al. | |
| 8,944,600 B2 | 2/2015 | Blixt et al. | |
| 8,982,046 B2 | 3/2015 | Edwards et al. | |
| 9,041,787 B2 | 5/2015 | Andersson et al. | |
| 9,070,017 B2 | 6/2015 | Hennessey et al. | |
| 9,110,504 B2 | 8/2015 | Lewis et al. | |
| 9,135,508 B2 | 9/2015 | Vaught et al. | |
| 2003/0016539 A1 * | 1/2003 | Minano | F21V 7/04 362/347 |

(Continued)

*Primary Examiner* — Michael Maskell
(74) *Attorney, Agent, or Firm* — Fish & Richardson P.C.

(57) ABSTRACT

An eye-safe optoelectronic module includes a light source mounted on a support and operable to generate light along an emission axis. An eye-safe substrate has an eye-safe substrate refractive index and includes at least one diffusive surface. The eye-safe substrate is mounted such that the emission axis is intercepted by the diffusive surface. An optical assembly includes at least one optical element, is composed of an optical material and is mounted on the diffusive surface of the eye-safe substrate such that the optical material fills a diffusive surface of the eye-safe substrate. The optical assembly has an optical assembly refractive index that is substantially the same as the eye-safe substrate refractive index.

18 Claims, 1 Drawing Sheet

(56) References Cited

U.S. PATENT DOCUMENTS

| | | | |
|---|---|---|---|
| 2005/0213180 A1* | 9/2005 | Lopez-Hernandez | G02B 5/0278 |
| | | | 359/237 |
| 2013/0223846 A1* | 8/2013 | Joseph | H04B 10/11 |
| | | | 398/119 |
| 2016/0164261 A1* | 6/2016 | Warren | H01S 5/18388 |
| | | | 348/164 |
| 2017/0343889 A1* | 11/2017 | Riel | G03B 21/2033 |

* cited by examiner

EYE-SAFE OPTOELECTRONIC MODULE

CROSS-REFERENCE TO RELATED APPLICATION(S)

This application claims the benefit of priority of U.S. Provisional Patent Application No. 62/346,736, filed on Jun. 7, 2016. The contents of the earlier application are incorporated herein by reference in their entirety.

FIELD OF THE DISCLOSURE

The present disclosure relates to eye-safe optoelectronic modules.

BACKGROUND

Optoelectronic modules operable to emit light may employ laser diodes or arrays of laser diodes (e.g., vertical-cavity surface-emitting laser diodes) to generate light, which may be coherent, collimated, focused, and/or have an intensity/power sufficient to cause harm to an eye or the skin of a human in proximity to such the optoelectronic module. During normal operation, the generated light may be incident on an optical assembly (e.g., an optical element or series of optical elements) configured to perform both an optical function (such as to generate a light pattern in a far-field or an image in a far-field relative to the optoelectronic module) and to eliminate or mitigate the harmful effects of the generated light. However, such an optoelectronic module may suffer various types of malfunctions which can compromise eye-safety and/or cause damage to skin. For example, in some instances, optoelectronic modules include optical elements composed of polymers, epoxies. The generated light (e.g., light generated by a laser diode or an array of laser didoes) may degrade such optical elements during operation, thereby seriously compromising their capacity to eliminate or mitigate the harmful effects of the generated light. In another example, an optical element may be mounted on a substrate, but may delaminate from the substrate during operation, thereby compromising eye-safety of the optoelectronic module.

SUMMARY

This disclosure describes eye-safe optoelectronic modules.

For example, in one aspect, an eye-safe optoelectronic module includes a light source mounted on a support and operable to generate light along an emission axis. An eye-safe substrate has an eye-safe substrate refractive index and includes at least one diffusive surface. The eye-safe substrate is mounted such that the emission axis is intercepted by the diffusive surface. An optical assembly, including at least one optical element, is composed of an optical material and is mounted on the diffusive surface of the eye-safe substrate such that the optical material fills the diffusive surface of the eye-safe substrate. The optical assembly has an optical assembly refractive index that is substantially the same as the eye-safe substrate refractive index.

Some implementations include one or more of the following features. For example, the light source can include an array of laser diodes (e.g., an array of vertical-cavity surface-emitting lasers) or an array of micro-lenses. In some cases, the light source is operable to emit infrared and/or near-infrared light.

In some instances, the optical element is composed of an optical polymer, and the eye-safe substrate is composed of an optical glass, wherein the optical polymer and optical glass have substantially similar refractive indices. In some cases, each of the eye-safe substrate refractive index and the optical assembly refractive index is in a range of 1.4-1.7. In some implementations, the optical assembly includes at least one diffractive optical element, refractive optical element, micro-lens array, or optical filter.

Other aspects, features and advantages will be readily apparent from the following detailed description, the accompanying drawings, and the claims.

DETAILED DESCRIPTION

Figure 1:
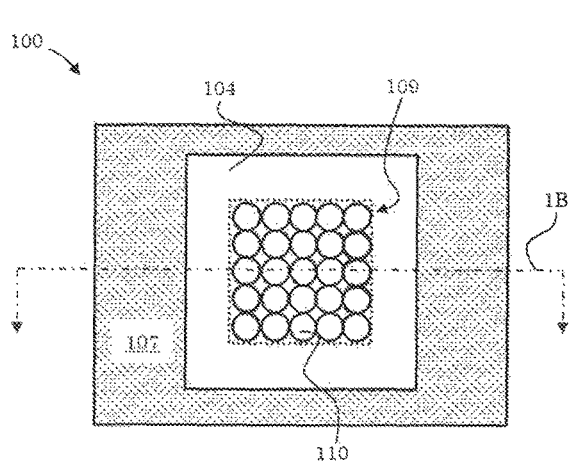
FIG. 1 illustrates a partial top view of an eye-safe optoelectronic module.
Figure 2:
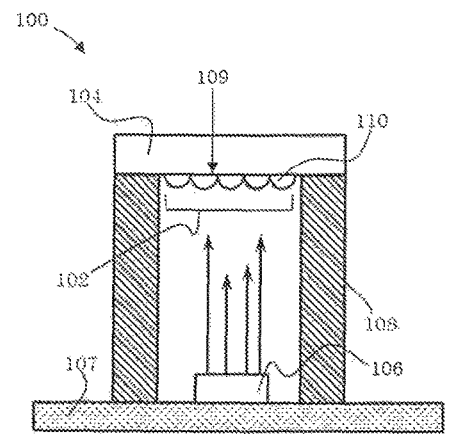
FIG. 2 illustrates a cross-sectional view of the eye-safe optoelectronic module taken along line 1B.

As shown in FIGS. 1 and 2, an eye-safe optoelectronic module 100 includes an optical assembly 102, an eye-safety substrate 104, and a light source 106. The light source 106 can be, for example, a light-emitting diode, a laser diode and/or an array of laser diodes (such as an array of vertical-cavity surface-emitting lasers), and can be mounted, for example, on a support 107 (e.g., a printed circuit board or lead fame). In some implementations, the light source is operable to emit infrared and/or near-infrared light (i.e., radiation). The eye-safety substrate 104 and/or the optical assembly 102 can be mounted to the support 107 via a spacer 108. In some instances, the spacer 108 is composed of a formable or substantially similar material such as an injected molded epoxy. In other instances, a lead frame is integrated into the spacer 108, which can be composed, for example, of a polymer or ceramic material.

The eye-safety substrate 104 includes at least one diffusive surface 109, and the optical assembly 102 includes at least one optical element 110 (e.g., refractive lens, diffractive lens, optical filter, diffractive optical element, and/or an array of micro-lenses) mounted on the diffusive surface 109. In the particular example illustrated in FIGS. 1 and 2, the light source 106 is depicted as an array of light sources (e.g., an array of vertical-cavity surface-emitting lasers), and the at least one optical element 110 mounted on the diffusive surface 109 of the eye-safety substrate 104 is depicted as a micro lens within an array of micro lenses. As indicated above, the light source 106 and/or optical element 110 can be implemented in other ways as well.

The eye-safety substrate 104 can be composed, for example, of a material (such as an optical glass) that resists degradation by light from the light source 106. Further, the eye-safety substrate 104 can be indexed-matched to the at least one optical element 110 mounted on the diffusive surface 109 of the eye-safety substrate 104. Thus, the eye-safety substrate 104 and the at least one optical element 110 can have the same or substantially the same refractive indices (i.e., such that the optical function of the eye-safe optoelectronic module 100 is not substantially effected). For example, in some implementations, each of the eye-safety substrate 104 and the at least one optical element 110 has a refractive index in the range of 1.4-1.7. Further, in some instances, the refractive indices differ from one another by no more than 7%, and preferably by no more than 2%, and more preferably by no more than 1%.

In some instances—e.g., where the optical element 110 is composed of a cured material, though formable in its uncured state—the optical element 110 is formed on top of the diffusive surface 109 such that the formable material used to form or replicate the optical element 110 fills in the region of the diffusive surface 109 at the same time the optical element 110 is formed or replicated.

In the event light generated from the light source 106 degrades the optical element 110 mounted to the diffusive surface 109, the formable material within the diffusive surface 109 also will be degraded, thus exposing the diffusive surface. Accordingly, light from the light source will be scattered from the diffusive surface 109 rendering it harmless (or at least less likely to cause harm) to humans in proximity to the eye-safe optoelectronic module 100. Similarly, in the event the optical element 110 delaminates from the diffusive surface 109, the diffusive surface 109 will render light form the light source harmless (or at least less likely to cause harm) to humans in proximity to the eye-safe optoelectronic module 100.

Other implementations are within the scope of the appended claims.

What is claimed is:

1. An eye-safe optoelectronic module comprising:
a light source mounted on a support, the light source operable to generate light along an emission axis;
an eye-safe substrate composed of a first material having an eye-safe substrate refractive index, the eye-safe substrate including at least one diffusive surface, wherein the eye-safe substrate is mounted such that the emission axis is intercepted by the diffusive surface;
an optical assembly including at least one optical element, the optical element being composed of an optical material different from the first material and being mounted on the diffusive surface of the eye-safe substrate such that the optical material fills the diffusive surface of the eye-safe substrate; and
the optical element having an optical assembly refractive index that is substantially the same as the eye-safe substrate refractive index.

2. The eye-safe optoelectronic module of claim 1 wherein the light source includes an array of laser diodes.

3. The eye-safe optoelectronic module of claim 2 wherein the array of laser diodes includes an array of vertical-cavity surface-emitting lasers.

4. The eye-safe optoelectronic module of claim 1 wherein the light source includes an array of micro-lenses.

5. An eye-safe optoelectronic module comprising:
a light source mounted on a support, the light source operable to generate light along an emission axis;
an eye-safe substrate having an eye-safe substrate refractive index, the eye-safe substrate being composed of an optical glass and including at least one diffusive surface, wherein the eye-safe substrate is mounted such that the emission axis is intercepted by the diffusive surface; and
an optical assembly including at least one optical element, wherein the optical element is composed of an optical polymer and is mounted on the diffusive surface of the eye-safe substrate such that the optical polymer fills the diffusive surface of the eye-safe substrate;
wherein the optical polymer and optical glass have substantially similar refractive indices as one another.

6. The eye-safe optoelectronic module of claim 1 wherein the optical assembly includes at least one diffractive optical element, refractive optical element, micro-lens array, or optical filter.

7. The eye-safe optoelectronic module of claim 1 wherein the light source is operable to emit infrared and/or near-infrared light.

8. The eye-safe optoelectronic module of claim 1 wherein the light source includes an array of vertical-cavity surface-emitting lasers operable to emit infra-red and/or near infra-red radiation, and wherein the at least one optical element includes an array of micro-lenses.

9. The eye-safe optoelectronic module of claim 1 wherein each of the eye-safe substrate refractive index and the optical assembly refractive index is in a range of 1.4-1.7.

10. The eye-safe optoelectronic module of claim 1 wherein the eye-safe substrate refractive index and the optical assembly refractive index differ from one another by no more than 1%.

11. The eye-safe optoelectronic module of claim 5 wherein the light source includes an array of laser diodes.

12. The eye-safe optoelectronic module of claim 11 wherein the array of laser diodes includes an array of vertical-cavity surface-emitting lasers.

13. The eye-safe optoelectronic module of claim 5 wherein the light source includes an array of micro-lenses.

14. The eye-safe optoelectronic module of claim 5 wherein the optical assembly includes at least one diffractive optical element, refractive optical element, micro-lens array, or optical filter.

15. The eye-safe optoelectronic module of claim 5 wherein the light source is operable to emit infrared and/or near-infrared light.

16. The eye-safe optoelectronic module of claim 5 wherein the light source includes an array of vertical-cavity surface-emitting lasers operable to emit infra-red and/or near infra-red radiation, and wherein the at least one optical element includes an array of micro-lenses.

17. The eye-safe optoelectronic module of claim 5 wherein the refractive index of each of the optical polymer and the optical glass is in a range of 1.4-1.7.

18. The eye-safe optoelectronic module of claim 5 wherein the respective refractive indices of the optical polymer and the optical glass differ from one another by no more than 1%.

* * * * *